United States Patent
Lee et al.

(10) Patent No.: US 8,628,621 B2
(45) Date of Patent: Jan. 14, 2014

(54) GAS INJECTOR AND FILM DEPOSITION APPARATUS HAVING THE SAME

(75) Inventors: Hyung Sup Lee, Gyeonggi-do (KR); Sung Tae Nam Goong, Gyeonggi-Do (KR); Kyoo Hwan Lee, Gyeonggi-Do (KR); Young Ho Kwon, Gyeonggi-Do (KR); Chang Jae Lee, Gyeonggi-Do (KR)

(73) Assignees: Jusung Engineering Co., Ltd. (KR); ADS (KR)

( * ) Notice: Subject to any disclaimer, the term of this patent is extended or adjusted under 35 U.S.C. 154(b) by 1134 days.

(21) Appl. No.: 12/344,489

(22) Filed: Dec. 27, 2008

(65) Prior Publication Data
US 2009/0165718 A1 Jul. 2, 2009

(30) Foreign Application Priority Data

Dec. 31, 2007 (KR) .................. 10-2007-0141273
Dec. 31, 2007 (KR) .................. 10-2007-0141274

(51) Int. Cl.
*C23C 16/00* (2006.01)
*B05B 1/24* (2006.01)
*B05B 1/00* (2006.01)

(52) U.S. Cl.
USPC ........ 118/724; 118/725; 239/132.1; 239/135; 239/139

(58) Field of Classification Search
USPC ........... 165/206, 218, 48.1, 50; 118/715, 724, 118/725, 666; 239/132.1, 132.3, 135, 139
See application file for complete search history.

(56) References Cited

U.S. PATENT DOCUMENTS

| | | | | |
|---|---|---|---|---|
| 5,935,337 A | * | 8/1999 | Takeuchi et al. | 118/724 |
| 5,950,925 A | * | 9/1999 | Fukunaga et al. | 239/132.3 |
| 6,453,992 B1 | * | 9/2002 | Kim | 165/206 |
| 2001/0003353 A1 | * | 6/2001 | Kawamoto | 239/310 |
| 2003/0148035 A1 | * | 8/2003 | Lingampalli | 427/421 |
| 2005/0011447 A1 | | 1/2005 | Fink | |

FOREIGN PATENT DOCUMENTS

| | | |
|---|---|---|
| JP | 07-273052 | 10/1995 |
| KR | 1020020027375 A | 4/2002 |
| KR | 10-2002-0051489 | 6/2002 |
| KR | 1020070094477 A | 9/2007 |
| KR | 10-2007-0101977 | 10/2007 |

* cited by examiner

*Primary Examiner* — Justin Jonaitis

(57) ABSTRACT

Provided are a gas injector and a film deposition apparatus having the same. The gas injector includes a body, a supply hole, an injection hole, and a distribution plate. The body is configured to provide an inner space therein. The supply hole is formed in an upper surface of the body to communicate with the inner space and receive a raw material. The injection hole is formed in a lower surface of the body to communicate with the inner space and inject the raw material. The distribution plate is disposed in the inner space of the body. A through hole is formed in the distribution plate. The distribution plate is disposed to be inclined at a predetermined angle with respect to a horizontal plane. The gas injector can uniformly inject the raw material and improve vaporization efficiency of the raw material having a powder form.

7 Claims, 7 Drawing Sheets

GAS INJECTOR AND FILM DEPOSITION APPARATUS HAVING THE SAME

CROSS-REFERENCE TO RELATED APPLICATION

This application claims priority to Korean Patent Application Nos. 10-2007-0141273 filed on Dec. 31, 2007 and 10-2007-0141274 filed on Dec. 31, 2007, and all the benefits accruing therefrom under 35 U.S.C. §119, the contents of which are incorporated by reference in their entirety.

BACKGROUND

The present disclosure relates to a film deposition apparatus, and more particularly, to a gas injector configured to efficiently vaporize a raw material having a powder form to improve deposition yield and configured to inject a uniform gas to improve film uniformity and a film deposition apparatus having the same.

In a process for fabricating a semiconductor device, a process in which a reaction gas reacts on a surface of a substrate to form a film formed of a required material is called a chemical vapor deposition (hereinafter, referred to as a "CVD") process.

In order to perform a related art deposition process, a film deposition apparatus includes a chamber, a substrate support, and a gas injector. The substrate support is disposed inside the chamber to support the substrate. The gas injector facing the substrate support is configured to supply a vaporized raw material to an upper surface of the substrate. Here, a predetermined space in which a raw material having a powder form is vaporized to store the vaporized raw material is provided within the gas injector. A plurality of injection holes is defined in a lower surface of the gas injector. The plurality of injection holes communicates with the predetermined space to inject the vaporized raw material onto the substrate.

The injection holes through which the vaporized raw material is injected include inlet ports configured to introduce the raw material having the powder form and outlet ports configured to discharge the vaporized raw material. The inlet ports and the outlet ports are vertically disposed with respect to each other. Thus, there is a limitation that the raw material that is not vaporized in the gas injector in time is injected into the chamber. In addition, portions of the outlet ports are disposed at positions corresponding to those of the inlet ports through which the raw material having the powder form is introduced. Thus, the outlet ports disposed at the positions corresponding to those of the inlet ports have a pressure greater than that of the outlet ports that are not disposed at the positions corresponding to those of the inlet ports. As a result, the raw material is not uniformly injected from the gas injector.

Therefore, the gas injection does not uniformly inject the raw material onto the upper surface of the substrate. Thus, it is difficult to form a uniform film on the upper surface of the substrate, and there is a limitation that the raw material having the powder form or particles is/are deposited on the upper surface of the substrate. In addition, the film is not uniformly deposited, and also, impurities are deposited to reduce processing yield.

SUMMARY

The present disclosure provides a gas injector configured to inject a uniform gas to improve film uniformity and a film deposition apparatus having the same.

The present disclosure also provides a gas injector configured to efficiently vaporize a raw material having a powder form to improve processing yield and a film deposition apparatus having the same.

In accordance with an exemplary embodiment, a gas injector includes: a body configured to provide an inner space therein; a supply hole formed in an upper surface of the body to communicate with the inner space and receive a raw material; an injection hole formed in a lower surface of the body to communicate with the inner space and inject the raw material; and a distribution plate disposed in the inner space of the body, the distribution plate including a through hole, wherein the distribution plate is inclined at a predetermined angle with respect to a horizontal surface.

The distribution plate may be disposed in the inner space between the supply hole and the injection hole.

The distribution plate may be inclined at an angle ranging from about 30 degrees to about 60 degrees with respect to the horizontal surface.

The injection hole may include a first injection hole and a second injection hole. The first and second injection holes are formed in a lower portion of the body and spaced apart from each other in a width direction. The distribution plate may include a first distribution plate disposed between the supply hole and the first injection hole and a second distribution plate disposed between the supply hole and the second injection hole.

The first distribution plate and the second distribution plate may be disposed perpendicular to the horizontal surface.

The gas injector may further include a heating unit configured to vaporize the raw material.

The injection hole may be formed at a position higher than that of a bottom surface of the inside of the body configured to provide the inner space therein.

In accordance with another exemplary embodiment a film deposition apparatus includes: a chamber; a substrate support disposed in a lower portion of the chamber to support a substrate; and a gas injector facing the substrate support, wherein the gas injector includes a distribution plate inclined at a predetermined angle with respect to a horizontal surface.

The film deposition apparatus may include: a body configured to provide an inner space therein; a supply hole formed in an upper surface of the body to communicate with the inner space and receive a raw material; an injection hole formed in a lower surface of the body to communicate with the inner space and inject the raw material; and a distribution plate disposed in the inner space of the body, the distribution plate including a through hole.

The distribution plate may be inclined at an angle ranging from about 30 degrees to about 60 degrees with respect to the horizontal surface.

In accordance with yet another exemplary embodiment, a gas injector includes: a heating unit configured to vaporize a raw material; and injection unit comprising an inner space provided under the heating unit, wherein a vaporized raw material from the heating unit is received into and stays in the inner space and a gas injection passage communicating with the inner space to penetratively extend toward a lower surface of the gas injection unit. Further, one end of the gas injection passage communicating with the inner space is formed at a position higher than that of a bottom surface of the inside of the injection unit configured to provide the inner space therein.

The gas injection passage may be bent.

The gas injection passage may include at least one planar portion and at least one vertical portion connected to the planar portion.

The injection unit may include a first injection unit configured to provide the inner space therein and a second injection unit coupled to the outside of the first injection unit, and the gas injection passage may be formed inside the first injection unit and the second injection unit.

The gas injection passage may extend from an inside surface of the first injection unit to a lower surface of the second injection unit.

The inner space may have one of a rectangular shape, a diamond shape, a circular shape, and an oval shape.

In accordance with still another exemplary embodiment, a film deposition apparatus includes: a chamber; a substrate support disposed in a lower portion of the chamber; and an injection unit comprising an inner space provided to be facing the substrate support, wherein a raw material stays in the inner space, and a gas injection passage communicating with the inner space to penetratively extend toward a lower surface of the gas injection unit. Further, one end of the gas injection passage is formed at a position higher than that of a bottom surface of the inside of the injector configured to provide the inner space therein.

BRIEF DESCRIPTION OF THE DRAWINGS

Exemplary embodiments can be understood in more detail from the following description taken in conjunction with the accompanying drawings, in which.

DETAILED DESCRIPTION OF EMBODIMENTS

Figure 1:
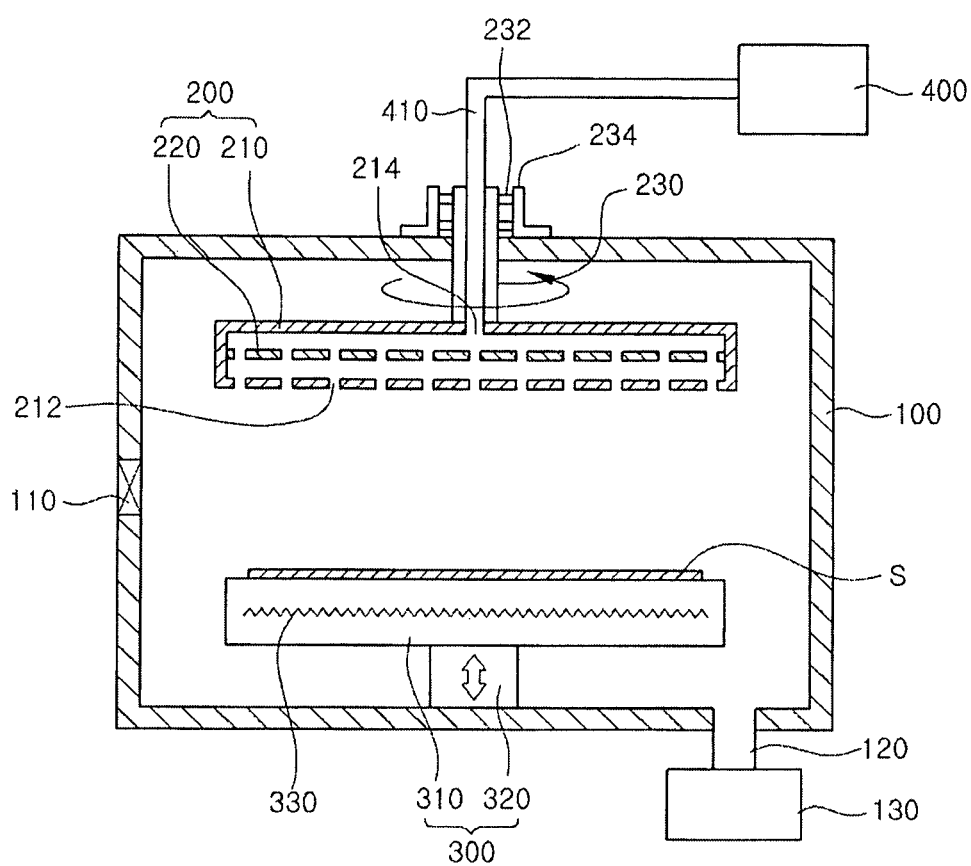
FIG. 1 is a schematic cross-sectional view of a film deposition apparatus in according with an exemplary embodiment.

Hereinafter, specific embodiments will be described in detail with reference to the accompanying drawings. The present invention may, however, be embodied in different forms and should not be constructed as limited to the embodiments set forth herein. Rather, these embodiments are provided so that this disclosure will be thorough aid complete, and will fully convey the scope of the present invention to those skilled in the art. Like reference numerals refer to like elements throughout.

Figure 2:
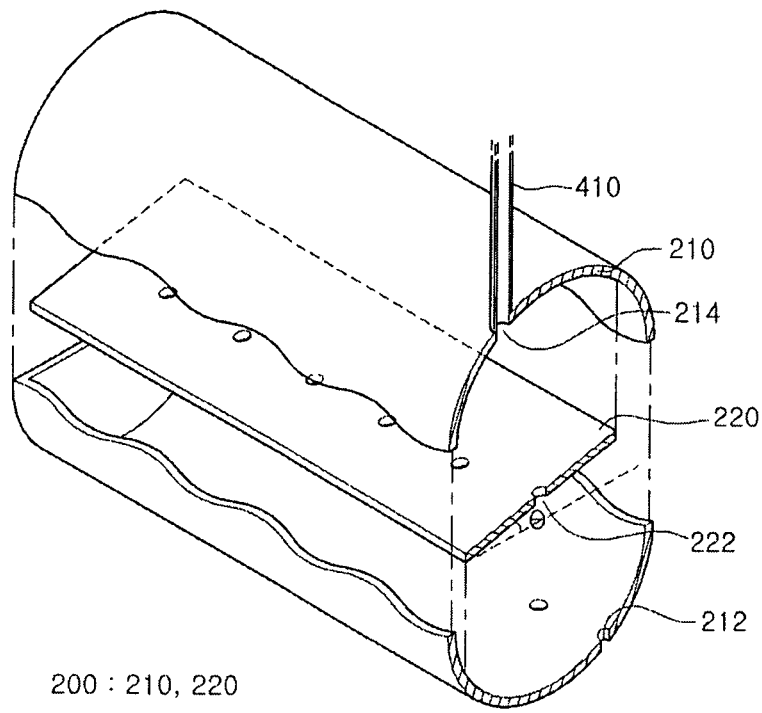
FIG. 2 is a partially cut-away perspective view of a gas injector in according with an exemplary embodiment.
Figure 3:
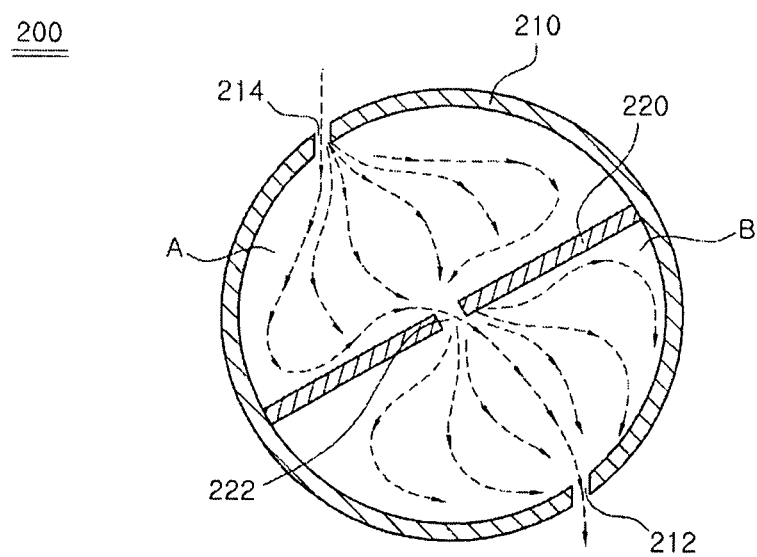
FIG. 3 is a vertical cross-sectional view of a gas injector in according with an exemplary embodiment.
Figure 4:
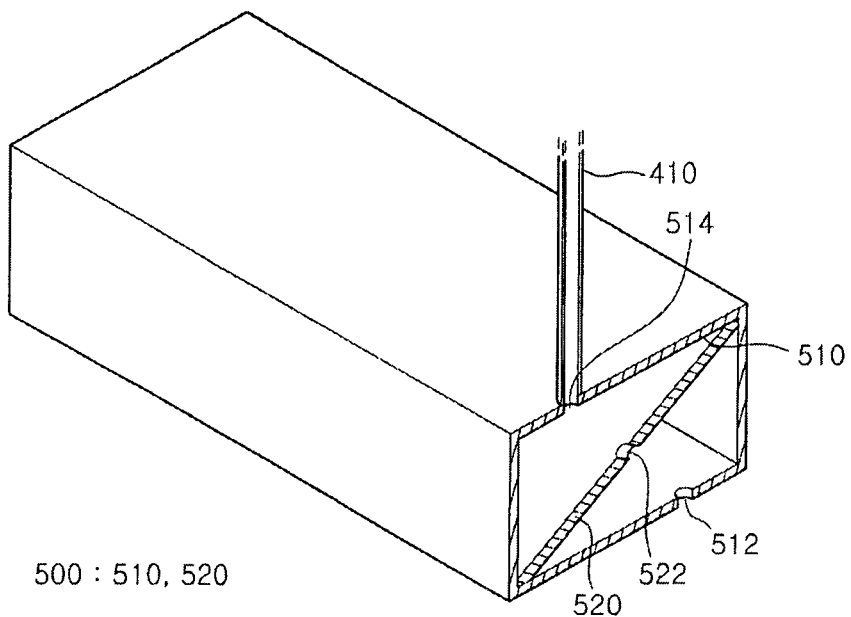
FIG. 4 is a partially cut-away perspective view of a gas injector in accordance with a modification of an exemplary embodiment.
Figure 5:
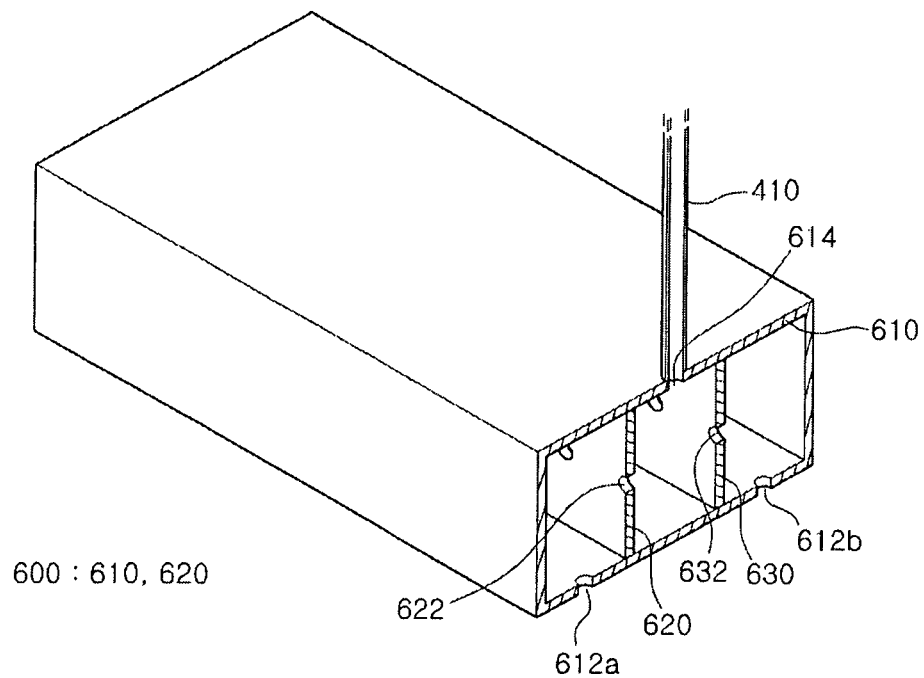
FIG. 5 is a partially cut-away perspective view of a gas injector in accordance with another modification of an exemplary embodiment.
Figure 6:
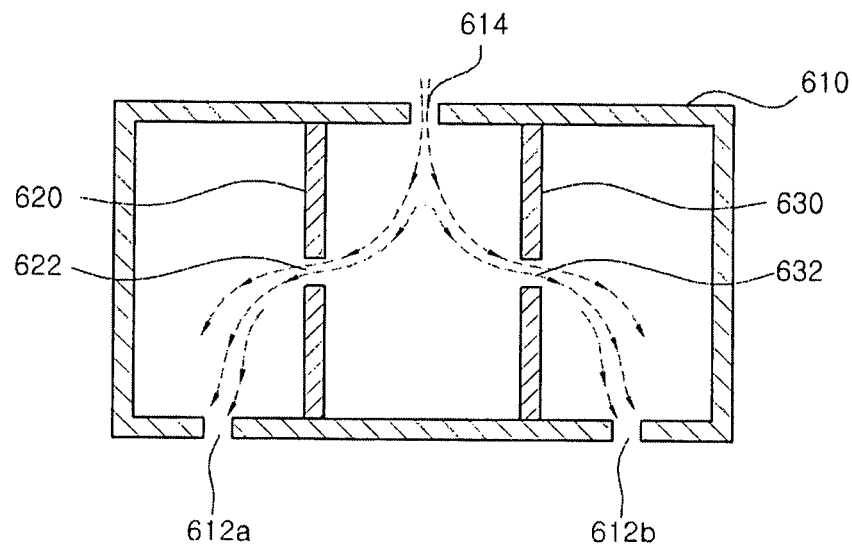
FIG. 6 is a cross-sectional view illustrating a gas flow within a gas injector in accordance with another modification of an exemplary embodiment.

FIG. 1 is a schematic cross-sectional view of a film deposition apparatus in according with an exemplary embodiment, and FIG. 2 is a partially cut-away perspective view of a gas injector in according with an exemplary embodiment. FIG. 3 is a vertical cross-sectional view of a gas injector in according with an exemplary embodiment, and FIG. 4 is a partially cut-away perspective view of a gas injector in accordance with a modification of an exemplary embodiment. FIG. 5 is a partially cut-away perspective view of a gas injector in accordance with another modification of an exemplary embodiment, and FIG. 6 is a cross-sectional view illustrating a gas flow within a gas injector in accordance with another modification of all exemplary embodiment.

Referring to FIG. 1, a film deposition apparatus in accordance with an exemplary embodiment includes a chamber 100, a gas injector 200 provided in an tipper portion of the chamber 100, a substrate support 300 facing, the gas injector 200.

The chamber 100 has a cylindrical shape or a rectangular box shape. A predetermined space is provided inside the chamber 100 to treat a substrate S. Although the chamber 100 has the cylindrical shape or a rectangular box shape, it is not limited thereto. For example, the chamber 100 may have a shape corresponding to that of the substrate S. A substrate entrance 10 through which the substrate S is loaded and unloaded is disposed in one sidewall of the chamber 100. The substrate entrance 110 may be disposed in the other sidewall of the chamber 100. An exhaust port 120 is disposed in a lower surface of the chamber 100 to exhaust gas within the chamber 100. The exhaust port 120 is connected to an exhaust unit such as a vacuum pump. Although the integrated chamber is illustrated and described, it is not limited thereto. For example, the chamber 100 may include a lower chamber having an opened upper portion and a chamber lid configured to cover the opened upper portion of the lower chamber.

The gas injector 200 in accordance with an exemplary embodiment is disposed in an upper portion of the chamber 100. The gas injector 200 supplies a vaporized raw material toward the substrate S while the gas injector 200 is horizontally rotated over the substrate S. The gas injector 200 has an injector type having a bar shape. The gas injector 200 vaporizes a raw material having a powder form supplied therein to supply the vaporized raw material onto the substrate S. A heating unit may be provided inside or outside the gas injector 200 to vaporize the raw material having the powder form supplied into the gas injector 200. A distribution plate 220 is disposed inside the gas injector 200. The distribution plate 220 uniformly disperses the raw material supplied into the gas injector 200 within the gas injector 200. A structure of the gas injector 200 will be described later in detail with reference to accompanying drawings. A rotation shaft 230 configured to horizontally rotate the gas injector 200 with respect to a central axis is connected to an upper portion of the gas injector 200. The rotation shaft 230 vertically passes through an upper surface of the chamber 100. A portion of an upper portion of the rotation shaft 230 protrudes from the upper surface of the chamber 100. A housing 234 and a sealing member 232 may be further provided. The housing 234 protrudes outwardly from the upper surface of the chamber 100 to support the upwardly protruding rotation shaft 230 and surround the rotation shaft 230. The sealing member 232 is configured to seal a gap between the housing 234 and the rotation shaft 230. A magnet seal may be used for the sealing member 232. Although not shown, a driving member (not shown) configured to rotate the rotation shaft 230, e.g., a motor may be further provided. A deposition source supply unit 400 configured to supply the raw material having the powder form into the gas injector 200 is provided outside the chamber 100. A supply conduit 410 is disposed to connect the deposition source supply unit 400 to the gas injector 200. That is, the raw material having the powder form supplied from the deposition source supply unit 400 is supplied into the gas injector 200 via the inside of the rotation shaft 230 through the supply conduit 410.

The substrate support 300 is disposed in a lower portion of the chamber 100. The substrate support 300 loads the substrate S within the chamber 100 to move the substrate S into a deposition position. The substrate support 300 includes a support 310 on which the substrate S is seated and a driving member 320 connected to a lower portion of the support 310. The support 310 has a shape corresponding to that of the substrate S. A heating member 330 may be disposed inside the support 310 to heat the substrate S seated on the support 310. For example, a resistance-heating heater may be used for the heating member 330. The driving member 320 is connected perpendicular to the lower portion of the support 310, and the support 310 ascends/descends or is rotated by the driving member 320.

Referring to FIGS. 1 through 3, the gas injector 200 in accordance with an exemplary embodiment includes a body 210 configured to provide a predetermined space therein and the distribution plate 220 disposed inside the predetermined space of the body 210.

The body 210 has a cylindrical bar shape and vaporizes the supplied raw material having the powder form to inject the vaporized raw material onto the substrate S. The predetermined space is defined inside the body 210 to vaporize the raw material having the powder form and uniformly disperse the vaporized raw material. A supply hole 214 communicating with the predetermined space is defined in an upper surface of the body 210. The supply hole 214 is connected to the supply conduit 410 through which the raw material is supplied. The predetermined space may have a circular shape corresponding to the cylindrical shape of the body 210, but it is not limited thereto. For example, the predetermined space may have various shapes such as a rectangular shape and a diamond shape. A plurality of injection holes 212 configured to inject the raw material vaporized within the body 210 is defined in a lower surface of the body 210. The injection holes 212 communicate with the predetermined space within the body 210. Each of the injection holes 212 may have a circular or polygonal shape but it is not limited thereto. For example, the injection hole 212 may have various shapes.

The distribution plate 220 is disposed in the predetermined space within the body 210. The distribution plate 220 prevents the raw material introduced from the supply hole 214 defined in the upper surface of the body 210 from being directly moved toward the injection holes 212 defined in the lower surface of the body 210. The distribution plate 220 has a rectangular plate shape. A through hole 222 is defined in the distribution plate 220 to vertically pass through the distribution plate 220. The distribution plate 220 is disposed at a predetermined angle with respect to the predetermined space within the body 210, i.e., a predetermined space between the supply hole 214 and the injection hole 212. Thus, the predetermined spaced within the body 210 may be divided into a first region A and a second region B. The distribution plate 220 may be inclined at an-angle ranging from about 30 degrees to about 60 degrees with respect to a horizontal surface. The through hole 222 vertically passing through the distribution plate 220 is provided in plurality. Although one distribution plate is provided in the body 210 in this embodiment it is not limited thereto. For example, a plurality of distribution plates may be provided in the body 210.

When the raw material having the powder ford is supplied into the first region A within the body 210 via the supply conduit 410 from the deposition source supply unit, the raw material supplied into the first region A is blocked by a surface of the distribution plate 220 disposed inside the body 210 and inclined at the predetermined angle. Thus, the raw material stays in the first region A for a predetermined time. The raw material staying in the first region A is sufficiently vaporized and uniformly dispersed within the first region A. The raw material vaporized and uniformly dispersed within the first region A is moved into the second region B through the through hole 222 defined in the distribution plate 220. In the raw material moved into the second region B through the through hole 222 defined ill the distribution plate 220, the raw material that is not vaporized in the first region A is vaporized again in the second region B to uniformly disperse the vaporized raw material. The dispersed raw material is injected outside of the body 210 through the injection hole 212 defined ill the lower surface of the body 210.

In a related art film deposition apparatus, since a supply hole through which a raw material is supplied is vertically overlapped with a portion of injection holes, or the portion of the injection holes is disposed at a position similar to the overlapped position, the portion of the injection holes has a pressure greater than those of another injection holes to reduce uniformity of the injected raw material.

On the other hand, in this embodiment, the distribution plate having the predetermined angle is disposed between the supply hole and the injection hole to change a movement path of the raw material. Thus, the raw material may be sufficiently dispersed within the gas injector such that the raw material supplied from the supply hole is not directly moved into the injection hole that is overlapped with the supply hole with the same vertical axis or disposed at a position similar to the overlapped position, thereby uniformly injecting the raw material. In addition, since the raw material sufficiently stays within the gas injector vaporization efficiency of the raw material having the powder form may increase.

Also, the gas injector in accordance with this embodiment may be constructed as illustrated in FIGS. 4 through 6.

Referring to FIG. 4, a gas injector 500 includes a body 510, a supply hole 514, an injection hole 512, and a distribution plate 520. The body 510 configured to provide a predetermined space therein. The supply hole 514 is defined in an upper surface of the body 510 to communicate with the predetermined space. The injection hole 512 is defined in a lower surface of the body 510 to communicate with the predetermined space. The distribution plate 520 is provided in the predetermined space within the body 510. The body has a cylindrical bar shape, and the predetermined space defined inside the body 510 has a rectangular shape corresponding to that of the body 510, but it is not limited thereto. For example, the predetermined space may have various shapes such as a rectangular shape and a diamond shape. The distribution plate 520 is provided in the predetermined space within the body 510. The distribution plate 520 is disposed at a predetermined angle within the body 510 to divide the predetermined space into two regions. The distribution plate 520 may be inclined at an angle ranging from about 30 degrees to about 60 degrees with respect to the lower surface of the body 510.

Referring to FIGS. 5 and 6, a gas injector 600 includes a body 610 configured to provide a predetermined space therein and distribution plates 620 and 630 provided in the body 610. The body 610 has a rectangular bar shape. A supply hole 614 communicating with the predetermined space is defined in an upper surface of the body 610. The supply hole 614 is connected to a supply conduit 410 through which a raw material is supplied. The injection hole includes a first injection hole 612a defined in a lower surface of the body 610 in a width direction and a second injection hole 612b spaced from the first injection hole 612a. The distribution plates 620 and 630 include a first distribution plate 620 and a second distribution plate 630 which are perpendicular to the lower surface of the body 610. The first distribution plate 620 is spaced from the second distribution plate 630. The first distribution plate 620 is disposed between the supply hole 614 and the first injection hole 612a, and the second distribution plate 630 is disposed between the supply hole 614 and the second injection hole 612b. The first distribution plate 620 is configured to induce the raw material supplied from the supply hole 614 to the first injection hole 612a, and the second distribution plate 630 is configured to induce the raw material supplied from the supply hole 614 to the second injection hole 612b. Through holes 622 and 632 are defined to horizontally pass through the first and second distribution plates 620 and 630, respectively.

When the raw material is supplied via a supply conduit 410 from the supply hole 614 defined in an upper surface of the body 610, the supplied raw material collides with walls of the first distribution plate 620 and the second distribution plate 630 to stay in a space between the first distribution plate 620 and the second distribution plate 630. The raw material sufficiently staying in the space between the first distribution plate 620 and the second distribution plate 630 is induced to the first injection hole 612a and the second injection hole 612b) through a through hole 622 defined in the first distribution plate 620 and a through hole 632 defined in the second distribution plate 630. Thereafter, the raw material is uniformly injected toward a lower surface of the body 610 through the first injection hole 612a and the second injection hole 612b).

Although the first distribution plate 620 and the second distribution plate 630 are disposed perpendicular to the lower surface of the body 610 in this embodiment, they are not limited thereto. For example, the first distribution plate 620 and the second distribution plate 630 may be inclined at a predetermined angle. Also, although the distribution plates 620 and 630 are divided into the first distribution plate 620 and the second distribution plate 630, they are not limited thereto. For example, three or more distribution plates may be provided.

The present disclosure is not limited to above described embodiments and may be realized with various embodiments. Descriptions with respect to another exemplary embodiment will now be described with reference to accompany drawings. Any particular features of the following another exemplary embodiment may be equally applied to those of the above-described exemplary embodiment.

Figure 7:
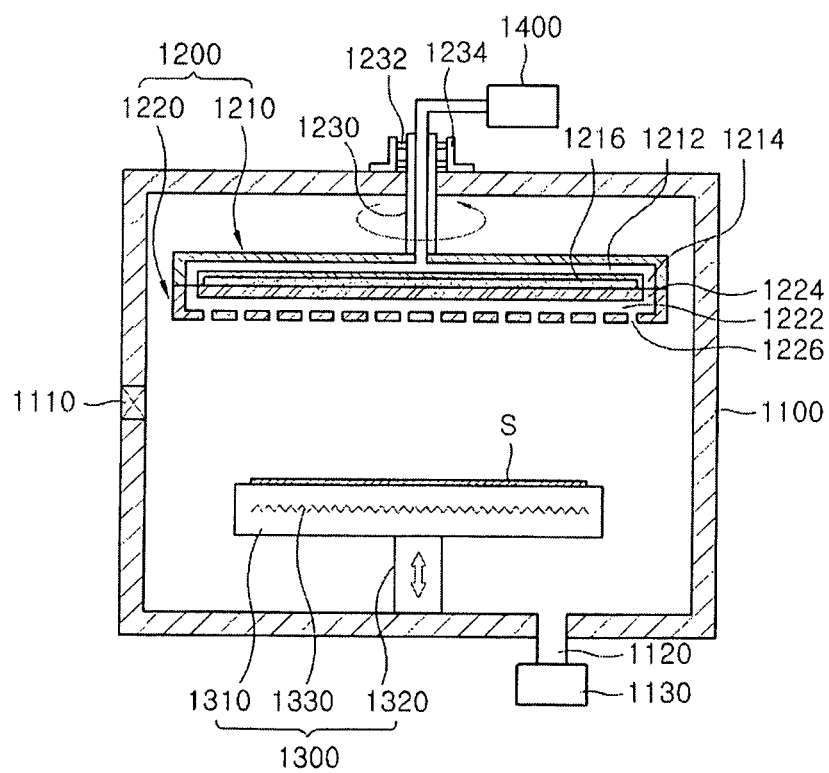
FIG. 7 is a schematic cross-sectional view of a film deposition apparatus including a gas injector in accordance with another exemplary embodiment.
Figure 8:
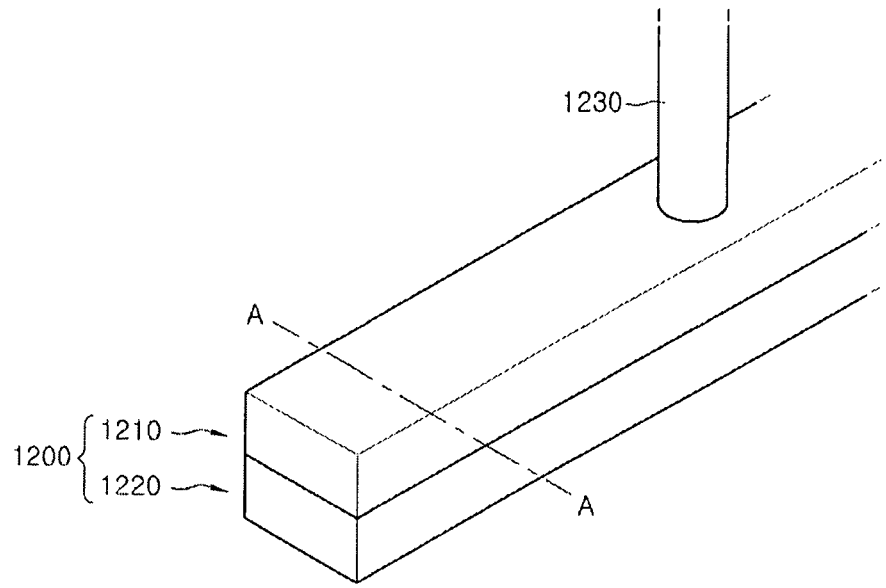
FIG. 8 is a partial perspective view illustrating an outward appearance of a gas injector in accordance with another exemplary embodiment.
Figure 9:
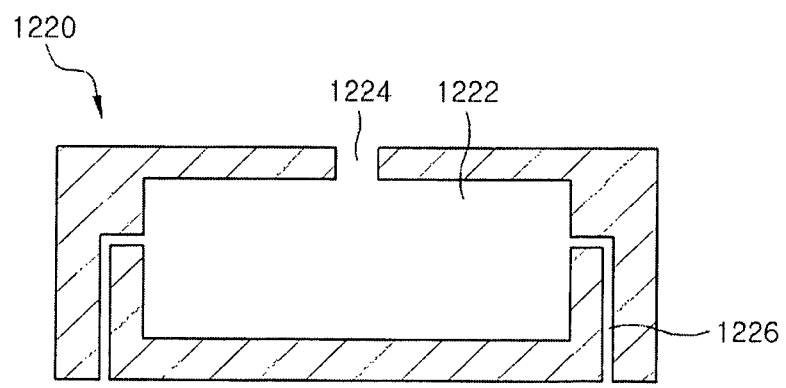
FIG. 9 is a cross-sectional view of an injection plate taken along line A-A of FIG. 8.

FIG. 7 is a schematic cross-sectional view of a film deposition apparatus including a gas injection apparatus in accordance with another exemplary embodiment, and FIG. 8 is a partial perspective view illustrating an outward appearance of a gas injection apparatus in accordance with another exemplary embodiment. FIG. 9 is a cross-sectional view of an injection plate taken along line A-A of FIG. 8, and FIGS. 10 through 13 are cross-sectional views of all injection plate provided in a gas injection apparatus in accordance with another exemplary embodiment.

Referring to FIG. 7, a film deposition apparatus in accordance with this embodiment includes a chamber 1100, a gas injector 1200 provided in an upper portion of the chamber 1100, a substrate support 1300 facing the gas injector 1200.

The chamber 1100 has a cylindrical shape or a rectangular box shape. A predetermined space is provided inside the chamber 1100 to treat a substrate S. Although the chamber 1100 has the cylindrical shape or a rectangular box shape, it is not limited thereto. For example, the chamber 1100 may have a shape corresponding to that of the substrate S. A substrate entrance 1110 through which the substrate S is loaded and unloaded is disposed in one sidewall of the chamber 1100. The substrate entrance 1110 may be disposed in the other sidewall of the chamber 1100. An exhaust port 1120 is disposed in a lower surface of the chamber 1100 to exhaust gas within the chamber 1100. The exhaust port 1120 is connected to an exhaust unit 1130 such as a vacuum pump. Although the integrated chamber is illustrated and described, it is not limited thereto. For example, the chamber 1100 may include a lower chamber having an opened upper portion and a chamber lid configured to cover the opened upper portion of the lower chamber.

The gas injector 1200 in accordance with an exemplary embodiment is disposed in an upper portion of the chamber 1100. The gas injector 1200 supplies a vaporized raw material toward the substrate S while the gas injector 1200 is horizontally rotated over the substrate S. The gas injector 1200 has an injector type having a bar shape. The gas injector 1200 vaporizes a raw material having a powder form supplied therein to supply the vaporized raw material onto the substrate S. The gas injector 1200 is configured to sufficiently vaporize the raw material having a powder form supplied therein to prevent the raw material that is not sufficiently vaporized or particles generated within the gas injector from being injected toward the substrate S. A structure of the gas injector 1200 will be described later in detail with reference to accompanying drawings. A rotation shaft 1230 configured to horizontally rotate the gas injector 1200 with respect to a central axis is connected to an upper portion of the gas injector 1200. A housing 1234 and a sealing member 1232 may be further provided. The housing 1234 protrudes outwardly from the upper surface of the chamber 1100 to support the upwardly protruding rotation shaft 1230 and surround the rotation shaft 1230. The sealing member 1232 is configured to seal a gap between the housing 1234 and the rotation shaft 1230. A magnet seal may be used for the sealing member 1232. Although not shown, a driving member (not shown) configured to rotate the rotation shaft 1230. e.g., a motor may be further provided. A deposition source supply unit 1400 configured to supply the raw material having the powder form into the gas injector 1200 is provided outside the chamber 1100. The raw material having the powder form supplied from the deposition source supply unit 1400 is supplied into the gas injector 1200 through the inside of the rotation shaft 1230.

The substrate support 1300 is disposed in a lower portion of the chamber 1100. The substrate support 1300 loads the substrate S within the chamber 1100 to move the substrate S into a deposition position. The substrate support 1300 includes a support 1310 on which the substrate S is seated and a driving member 1320 connected to a lower portion of the support 1310. The support 1310 has a shape corresponding to that of the substrate S. The support 1310 may include a temperature control unit such as a heating member or a cooling member such that the substrate S is maintained at a temperature suitable for a substrate treatment process while the process for treating the substrate S seated on the support 1310 is performed. The driving member 1320 is connected perpendicular to the lower portion of the Support 1310, and the support 1310 ascends/descends or is rotated by the driving member 1320.

Referring to FIGS. 7 through 9, the gas injector 1200 in accordance with this embodiment includes a heating plate 1210 and an injection plate 1220 provided in a lower surface of the heating plate 1210. A rotation shaft 1230 configured to rotate the heating plate 1210 and the injection plate 1220 with respect to a vertical axis may be further connected to an upper surface of the heating plate 1210.

The heating plate 1210 has a rectangular bar shape and receives the raw material having the powder form to vaporize the supplied raw material A first passage 1212 disposed in a length direction of the heating plate 1210 to store the raw material having the powder form is provided inside the heating plate 1210. A deposition source supply unit 1400 is connected to an upper surface of the heating plate 1210 to communicate with the first passage 1212. A supply hole 1214 passes through an edge of a lower surface of the heating plate 1210 to communicate with the first passage 1212. The first passage 1212 may be sufficiently long such that the raw material having the powder fort is sufficiently vaporized within the first passage 1212. A heating member 1216 configured to heat the heating plate 1210 to vaporize the raw material having the powder form supplied into the heating plate 1210 is provided in the lower surface of the heating plate 1210. An inwardly concave recess may be disposed in a central region of the lower surface of the heating plate 1210 to receive the heating member 1216. A core heater may be used for the heating member 1216. The heating member 1216 may be disposed such that the heating member 1216 does not interfere with the supply hole 1214 defined in the edge of the lower surface of the heating plate 1210.

The injection plate 1220 is disposed on the lower surface of the heating plate 1210 to surface-contact with the lower surface of the heating plate 1210. The injection plate 1220 is configured to inject the raw material vaporized from the heating plate 1210 toward the substrate S. Simultaneously, the injection plate 1220 is configured to vaporize the raw material that is not sufficiently vaporized by the heating plate 1210. In addition, the injection plate 1220 is configured to prevent a foreign substance such as particles generated within the heating plate 1210 and the injection plate 1220 from being injected into the chamber 1100.

A communication hole 1224 is defined in an upper surface of the injection plate 1220 to receive the raw material vaporized from the heating plate 1210. A predetermined inner space, i.e., a second passage 1222 is provided inside the injection plate 1220 to communicate with the communication hole 1224. The communication hole 1224 may be disposed at a position corresponding to that of the supply hole 1214 defined in the lower surface of the heating plate 1210. Thus, the raw material supplied from the supply hole 1214 is supplied into the second passage 1222 through the communication hole 1224. A plurality of gas injection passages 1226 is provided in a lower surface of the injection plate 1220 in a length direction of the injection plate 1220 to communicate with the second passage 1222. The gas injection passage 1226 has one end extending form one sidewall of an inside of the injection plate 1220 including the second passage 1222 to form a "¬" shape in section. The gas injection passage 1226 may be disposed on the other sidewall facing the one sidewall of the inside of the injection plate 1220 including the second passage 1222. The one end of the gas injection passage 1226 disposed in the inside wall of the injection plate 1220 may be disposed at a position higher than that of a bottom surface of the injection plate 1220 including the second passage 1222.

When the raw material having the powder form is supplied from a deposition source supply unit 1440 to the first passage 1212 within the heating plate 1210, the heating plate 1210 is heated at a predetermined temperature by heating member 1216 disposed on a lower portion of the heating plate 1210. Thus, the raw material having the powder form supplied into the heating plate 1210 is vaporized and uniformly dispersed inside the first passage 1212 while the raw material is moved from a central portion of the first passage 1212 toward both edges. The raw material uniformly dispersed inside the first passage 1212 is supplied into the communication hole 1224 defined in the upper surface of the injection plate 1220 through the supply hole 1214 defined in the edge of the lower surface of the heating plate 1210. Thereafter, the vaporized raw material supplied into the injection plate 1220 is moved inside the second passage 1222 and uniformly disposed inside the second passage 1222. Since the upper surface of the injection plate 1220 is contactingly coupled to the lower surface of the heating plate 1210, heat applied into the heating plate 1210 is conducted to the injection plate 1220. Thus, the vaporized raw material supplied into the injection plate 1220 is not condensed, but maintained in a vaporization state. Also, the raw material supplied into the second passage 1222 may contain the raw material that is not sufficiently vaporized by the heating plate 1210 and the foreign substance such as the particles generated within the heating plate 1210 and the injection plate 1220.

The vaporized raw material is injected into the chamber 1100 through the one end of the gas injection passage 1226 disposed in the inside wall of the injection plate 1220 including the second passage 1222 and through the other end of gas injection passage 1226 penetratively extending up to the lower surface of the injection plate 1220. Therefore, a desired film is provided oil an upper surface of the substrate S. The raw material that is not sufficiently vaporized by the heating plate 1210 is not directly injected through the gas injection passage 1226, but sufficiently stays within the second passage 1222 to vaporize the raw material within the injection plate 1220. Thereafter, the vaporized raw material is injected into the chamber 1100 through the gas injection passage 1226. The gas injection passage 1226 is long enough to cross a movement direction of the raw material introduced through the communication hole 1224 of the injection plate 1220. Thus, when the raw material having the powder form is not sufficiently vaporized within the second passage 1222, the raw material that is not vaporized is introduced and stays into/in the gas injection passage 1226. As a result, the raw material may be sufficiently vaporized within the gas injection passage 1226. Thus, the raw material vaporized within the gas injection passage 1226 is injected into the chamber 1100 to form the desired film on the substrate S. Also, since the gas injection passage 1226 disposed in the inside wall of the injection plate 1220 including the second passage 1222 is disposed at the position higher than that of the bottom surface of the injection plate 1220 including the second passage 1222, the particles introduced into the second passage 12222 settle down a floor of the second passage 1222, and thus, it can prevent the particles from being injected into the chamber 1100.

Although the gas injection passage is disposed inside the injection plate in this embodiment, it is not limited thereto. For example, a gas injection passage having a pipe shape may be disposed in an outside wall to communicate with the second passage disposed in the injection plate.

In a related art film deposition apparatus, since an injection hole defined in a lower surface of a gas injector is vertically disposed with respect to an inlet port through which a raw material is introduced and an outlet port through which the raw material is discharged, the raw material that is not sufficiently vaporized in the gas injector is directly injected into a chamber through a injection hole via a predetermined space within the gas injector. As a result, there is a limitation that the raw material that is not sufficiently vaporized may be directly supplied toward a substrate to reduce a processing yield. In addition, there is a limitation that a foreign substance such as particles that may be generated within the gas injector may be directly injected into the chamber through a through hole via the predetermined space to reduce the processing yield.

On the other hand, in this embodiment, since the gas injection passage is bent toward the inside wall of the injection plate including the second passage, it can prevent the raw material that is not sufficiently vaporized by the heating plate and the foreign substance such as the particles from being directly injected onto the substrate through the second passage and the gas injection passage. That is, the raw material that is not sufficiently vaporized can stay in the second passage for a long time to prevent the raw material that is not sufficiently vaporized is vaporized within the second passage to prevent the raw material that is not sufficiently vaporized from being injected onto the substrate. In addition, since a path of the gas injection passage is longer and complicated as compared with that of the related art gas injection hole, the raw material that is not sufficiently vaporized can stay in the gas injection passage for a relatively long time to vaporize the raw material that is not sufficiently vaporized in the gas injection passage. In addition, since the gas injection passage may be disposed in the one sidewall and the other sidewall of the inside of the injection plate including the second passage to increase the number of the gas injection passages, uniformity of the film deposited on the substrate can be improved.

The gas injection passage disposed in the injection plate may be constructed as illustrated in FIGS. 10 through 13.

Figure 10:
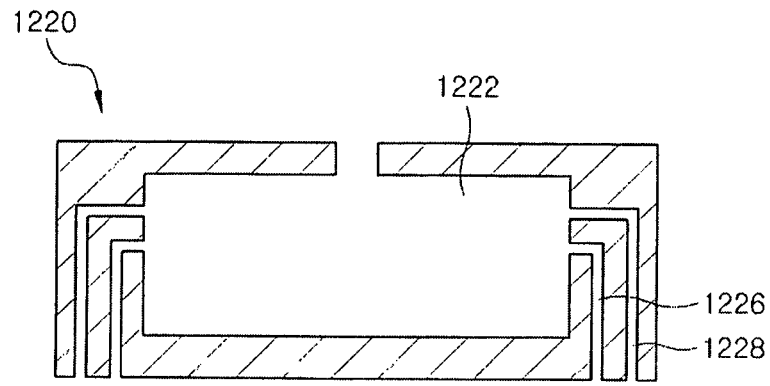
FIGS. 10 through 13 are cross-sectional views of an injection plate provided in a gas injector in accordance with another exemplary embodiment.

Referring to FIG. 10, gas injection passages 1226 and 1228 are provided in plurality to communicate with a predetermined inner space provided in an injection plate 1220, i.e., a second passage 1222. That is, the first gas injection passage 1226 is disposed in an inside wall of the injection plate 1220 including the second passage 1222 to communicate with the second passage 1222 from a lower portion of the injection plate 1220. The second gas injection passage 1228 is spaced a predetermined distance from the first gas injection passage 1226. That is, the second gas injection passage 1228 has one end disposed in a lower surface of the injection plate 1220 and spaced the predetermined distance toward the outside of one end of the first gas injection passage 1226. The second gas injection passage 1228 has the other end spaced from the other end of the first gas injection passage 1226. The other end of the second gas injection passage 1228 may be disposed over the other end of the first gas injection passage 1226 with the same axis. Thus, a plurality of gas injection passages 1226 and 1228 may be provided in the injection plate 1220. Therefore, the number of the gas injection passages 1226 and 1228 through which the raw material is injected onto the substrate S may increase to improve film uniformity of the substrate S.

Figure 11:
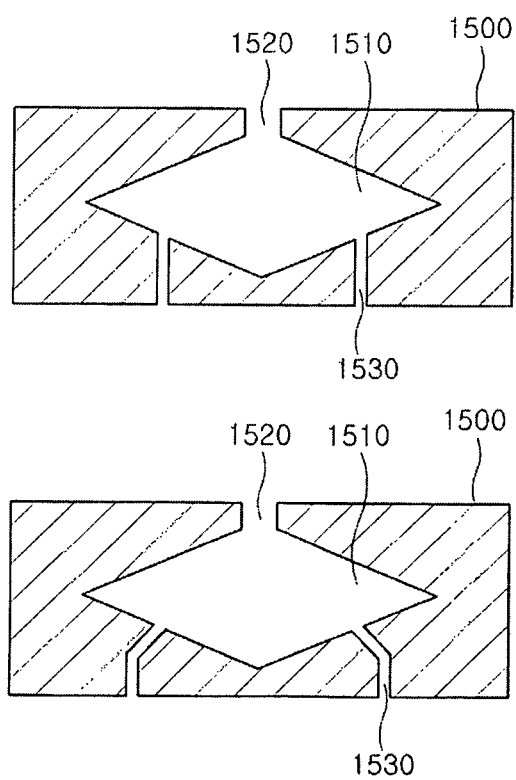

Referring to FIG. 11, a predetermined inner space, i.e., a second passage 1510 is provided in an injection plate 1500. The second passage 1510 has a diamond shape in section. A plurality of gas injection passages 1530 is disposed in a lower portion of the injection plate 1500. The gas injection passages 1530 communicate with the second passage 1510. As illustrated in an upper drawing of FIG. 11, each of the gas injection passages 1530 may have a pipe shape extending in one direction. As illustrated in a lower drawing of FIG. 11 each of the gas injection passages 1530 may have a bent shape. The gas injection passage 1530 has one end communicating with the second passage 1510. The one end of the gas injection passage 1530 may be disposed at a position higher than that of a bottom surface of the inside of the injection plate including the second passage 1510.

Figure 12:
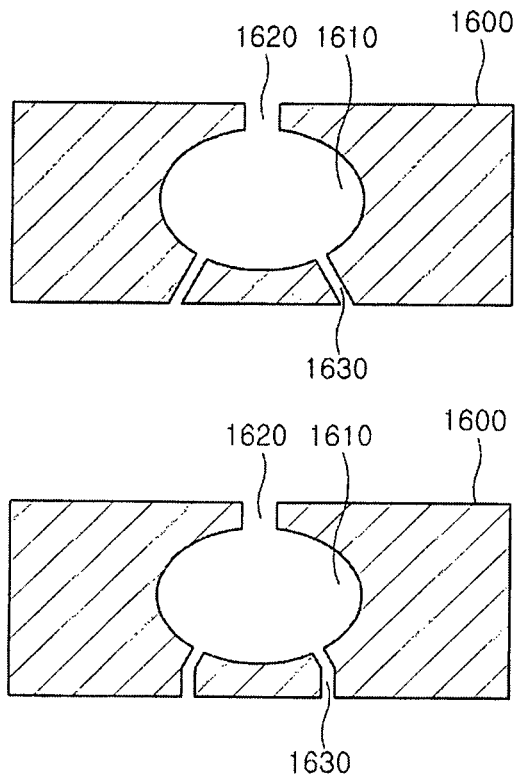

Referring to FIG. 12, a predetermined inner space provided in an injection plate 1600, i.e., a second passage 1610 has a circular or oval shape. A plurality of gas injection passages 1630 is disposed in a lower portion of the injection plate 1600 to communicate with the second passage 1610. As illustrated in an upper drawing of FIG. 12, each of the gas injection passages 1630 may have a pipe shape extending in one direction, and inclined at a predetermined angle in the lower portion of the injection plate 1600. As illustrated in a lower drawing of FIG. 12, each of the gas injection passages 1630 may have a bent shape. The gas injection passage 1630 has one end communicating with the second passage 1610. The one end of the gas injection passage 1630 may be disposed at a position higher than that of a bottom surface of the inside of the injection plate including the second passage 1610.

Figure 13:
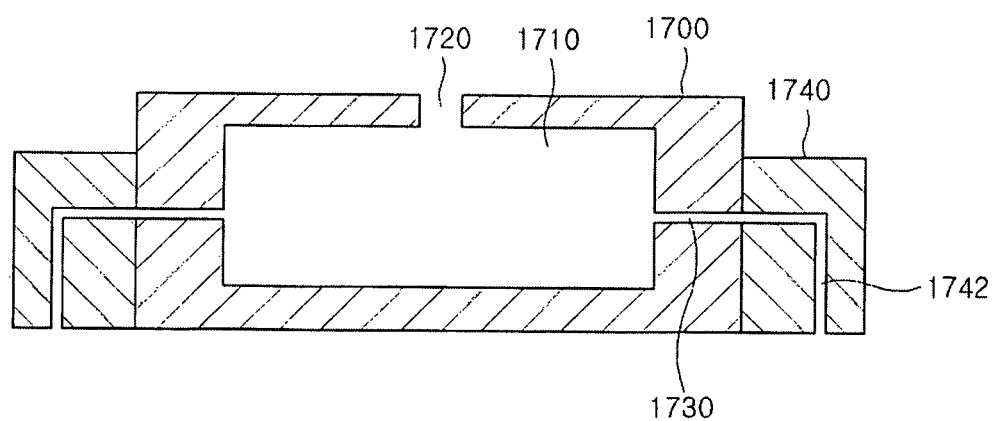

Referring to FIG. 13, injection plates 1700 and 1740 include a first injection plate 1700 and a second injection plate 1740 coupled to the outside of the first injection plate 1700. A second passage 1710 is provided in the first injection plate 1700. The second passage 1710 has a rectangular shape in section. A gas injection passage 1742 is provided in the first injection plate 1700 and the second injection plate 1740, and thus, the first injection plate 1700 communicates with the second injection plate 1740. The gas injection passage 1742 extends from a side surface of the first injection plate 1700 to a lower surface of the second plate 1740. The gas injection passage 1742 has one end communicating with the second passage 1710. The one end of the gas injection passage 1742 may be disposed at a position higher than that of a bottom surface of the inside of the first injection plate 1700 including the second passage 1710.

The distribution plate inclined at the predetermined angle can be disposed between the supply hole and the injection hole of the gas injector to uniformly inject the raw material.

The raw material can sufficiently stay in the gas injector to improve the vaporization efficiency of the raw material having a powder form.

The vaporized raw material can be uniformly injected onto the upper surface of the substrate to increase the uniformity of the film.

The one end of the gas injection passage can be disposed in the inside wall of the distribution plate including the passage to prevent the raw material that is not sufficiently vaporized or the foreign substance such as the particles from being directly injected onto the substrate.

The relatively long gas injection passage can be provided to vaporize the raw material that is not vaporized within the gas injection passage again. Thus, it can prevent the raw material that is not vaporized from being injected toward the substrate.

The number of the gas injection passages can increase to improve the film uniformity of the substrate.

A net can be further disposed within the gas injection passage to prevent the raw material that is not vaporized or the foreign substance such as the particles from being injected toward the substrate.

Although the gas injector and the film deposition apparatus having the same have been described with reference to the specific embodiments, they are not limited thereto. Therefore, it will be readily understood by those skilled in the art that various modifications and changes can be made thereto without departing from the spirit and scope of the present invention defined by the appended claims.

What is claimed is:
1. A gas injector comprising:
a body configured to provide an inner space therein;

a supply hole formed in an upper surface of the body to communicate with the inner space and receive a raw material;

a plurality of injection holes formed in a lower surface of the body to communicate with the inner space and inject the raw material into a chamber which the gas injector is at least partially housed; and a distribution plate disposed in the inner space of the body, the distribution plate comprising a plurality of through holes, wherein:

the distribution plate includes at least a portion inclined at a predetermined angle with respect to a horizontal surface to divide the inner space of the body into a first region having the supply hole therein and a second region having the plurality of injection holes therein; and the plurality of through holes are disposed on the portion of the distribution plate inclined at the predetermined angle.

2. The gas injector of claim 1, wherein the distribution plate is disposed in the inner space between the supply hole and the injection hole.

3. The gas injector of claim 2, wherein the distribution plate is inclined at an angle ranging from about 30 degrees to about 60 degrees with respect to a horizontal surface.

4. The gas injector of claim 1, further comprising a heating unit to vaporize the raw material.

5. The gas injector of claim 1, wherein the injection holes are formed at a position higher than that of a bottom surface of the lower surface inside of the body configured to provide the inner space therein.

6. A gas injector comprising:

a body having an inner space therein; a supply hole formed in an upper surface of the body arranged and structured to communicate with the inner space and arranged and structured to receive a raw material having a powder form;

a heating unit disposed inside or outside of the body to vaporize the raw material having the powder form;

a plurality of injection holes formed in a lower surface of the body to communicate with the inner space and to inject the vaporized raw material into a chamber which the gas injector is at least partially housed; and a distribution plate disposed in the inner space of the body to divide the inner space of the body into a first region having the supply hole therein and a second region having the plurality of injection holes therein, the distribution plate comprising a plurality of through holes, wherein the distribution plate includes at least a portion inclined at an angle ranging from 30 degrees to 60 degrees with respect to a horizontal surface, and the through holes are disposed in the inclined portion of the distribution plate.

7. The gas injector of claim 4, wherein the heating unit is disposed inside of the body.

* * * * *